United States Patent [19]
Kajimura et al.

[11] 4,176,325
[45] Nov. 27, 1979

[54] SEMICONDUCTOR LASER DEVICE

[75] Inventors: Takashi Kajimura, Kokubunji; Kazutoshi Saito; Noriyuki Shige, both of Hachioji; Michiharu Nakamura, Tokyo; Jun-ichi Umeda; Masayoshi Kobayashi, both of Hachioji, all of Japan

[73] Assignee: Hitachi, Ltd., Japan

[21] Appl. No.: 843,365

[22] Filed: Oct. 19, 1977

[30] Foreign Application Priority Data

Oct. 22, 1976 [JP] Japan .............................. 51-126044
Mar. 18, 1977 [JP] Japan .............................. 52-29205

[51] Int. Cl.² .............................................. H01S 3/19
[52] U.S. Cl. .............................. 331/94.5 H; 357/18
[58] Field of Search ...................... 331/94.5 H; 357/18

[56] References Cited

U.S. PATENT DOCUMENTS 4,121,177  10/1978  Tsukada ........................ 331/94.5 H

OTHER PUBLICATIONS

Itoh et al., "Embedded-Stripe GaAs-GaAlAs Double-Heterostructure Lasers with Polycrystalline GaAsP Layers-1: Lasers with Cleaved Mirrors," *IEEE Journal of Quantum Electronics*, vol. QE-13, No. 8, Aug. 1977, pp. 623–627.( Burnham et al., "Distributed Feedback Buried Heterostructure Diode Laser," *Applied Physics Letters*, vol. 29, No. 5, Sep. 1, 1976, pp. 287–289.

Tsukada, "GaAs-Ga$_{1-x}$Al$_x$As Buried-Heterostructure Injection Lasers," *J. of Applied Physics*, vol. 45, No. 11, Nov. 1974, pp. 4899–4906.

*Primary Examiner*—James W. Davie
*Attorney, Agent, or Firm*—Craig and Antonelli

[57] ABSTRACT

A semiconductor laser device capable of emitting highly collimated beams, especially of a narrow beam divergence, is disclosed. A striped hetero-junction is formed on a predetermined semiconductor substrate by a first semiconductor layer (refractive index: $n_1$, band gap: $Eg_1$, thickness: d), a second semiconductor layer ($n_2$) and a third semiconductor layer ($n_3$), and the hetero-junction is sandwiched between portions of a fourth semiconductor layer ($n_4$, $Eg_4$) into a buried structure. At this time, the various materials are selected to follow the relations of $d \leq \lambda$ (where $\lambda$ denotes the oscillation wavelength of the semiconductor laser), $n_2, n_3 < n_4 < n_1$, and $Eg_1 < Eg_4$, and the effective refractive index of the first semiconductor layer ($n_{1eq}$) is made smaller than $n_4$.

22 Claims, 7 Drawing Figures

SEMICONDUCTOR LASER DEVICE

BACKGROUND OF THE INVENTION

1. Field of the Invention

This invention relates to a semiconductor laser, and more particularly to a leaky-mode buried-heterostructure laser.

2. Brief Description of the Prior Art

Heretofore, as a semiconductor laser wherein light generated and propagated in a p-n junction is subjected to the laser oscillation by a resonator structure, the double heterostructure which exhibits a good optical confinement in the junction region has been often employed. The double heterostructure is such that a semiconductor layer (for example, GaAlAs layer) having a low refractive index and a high band-gap energy is joined on both sides of a semiconductor region (for example, GaAs layer) serving as an active layer in which the laser oscillation is carried out.

The double heterostructure has differences in the refractive index in a direction perpendicular to the hetero-junction, but it exhibits no difference in the refractive index in a direction parallel to the hetero-junction. It is the mesa-stripe type double heterostructure that has been devised in order to bestow a refractive index variation in the lateral direction. This structure is obtained in such a way that crystal surfaces parallel to the hetero-junctions of the double heterostructure are subjected to the mesa-etching, to form a striped mesa and to make the active layer striped. Therefore, an external space or a different substance adjoins directly onto both lateral sides of the active layer, and differences in the refractive index are exhibited also in the lateral direction. This structure is further classified into the high-mesa type and the low-mesa type in dependence on the depth of the mesa-etching, and when compared with the prior-art double-heterostructure laser, it has the merits that the optical confinement is effective and that the spreading of current in the lateral direction does not occur. These facts have been published in, e.g., "Appl. Phys. Letters," vol. 20, p 344–345, May 1972, or "IEEE J. Quantum Electronics," vol. QE-9, No. 2, Feb 1973.

Further, when a semiconductor layer of low refractive index is grown once more around the striped region subjected to the mesa-etching, there is obtained a structure in which the striped active region of high refractive index is surrounded by the semiconductor material of low refractive index. With such a structure, the active region is enclosed with the semiconductor material having a similar refractive index, and hence, its optical characteristics are improved. The details of the structure are disclosed in, e.g., Japanese Laid-Open of Patent Application Nos. 50-10985 and 50-10986. A semiconductor laser wherein stripes for preventing the spreading of current are disposed over and under the active layer is disclosed in U.S. Pat. No. 3,849,790.

In the semiconductor lasers of the wave guiding structures thus far described, however, the diffraction phenomenon of light arises in consequence of the confinement of light, and laser beams are emitted at considerably wide angles of divergence. The beam divergence is approximately 8°–30° though, of course, it varies depending on the structure of the particular semiconductor laser.

The intensity distribution of a laser beam which is emitted from a semiconductor laser has a Fourier transform relationship with the light intensity distribution within the laser. Accordingly, the reduction of the beam divergence is possible in principle by rendering the area of an optical confinement region large. However, when the optical confinement region is expanded, laser oscillations in lateral higher-order modes become prone to develop. The development of the laser oscillations in the higher-order modes results in spreading the divergence angle of the laser beam as a whole. For this reason, it is very difficult to make the beam divergence less than 8° in the semiconductor lasers of the prior-art structures.

SUMMARY OF THE INVENTION

This invention has for its object to realize a semiconductor laser which emits highly collimated beams of narrow beam divergence. The semiconductor laser of this invention is also meritorious against the degradation due to damages of the end facets of the semiconductor laser.

In order to accomplish the object, a structure to be described below is adopted. An optical confinement region is provided on a predetermined semiconductor substrate. The optical confinement region is so constructed that, on both sides of a first semiconductor layer whose thickness is equal to or less than the oscillation wavelength of the semiconductor laser, a second semiconductor layer and a third semiconductor layer which have refractive indices lower than that of the first semiconductor layer and whose conductivity types are opposite to each other are provided. The multi-layer which consists of the first semiconductor layer and the second and third semiconductor layers is sandwiched between portions of a fourth semiconductor layer so that the portions may adjoin the respective semiconductor layers. The fourth semiconductor layer is provided so as to have a band gap wider than that of the first semiconductor layer and to have a refractive index higher than those of the second and third semiconductor layers. In this way, the effective refractive index of the first semiconductor layer is made lower than the refractive index of the fourth semiconductor layer, whereby a leaky-mode buried-heterostructure laser is realized. In practical use, the thickness of the first semiconductor layer is made about 0.05 μm–0.22 μm.

In a preferred example of this invention, the first semiconductor layer, the second semiconductor layer, the third semiconductor layer and the fourth semiconductor layer are respectively made of $Ga_{1-x_1}Al_{x_1}As$, $Ga_{1-x_2}Al_{x_2}As$, $Ga_{1-x_3}Al_{x_3}As$ and $Ga_{1-x_4}Al_{x_4}As$ where $0 \leq x_1 < x_4 < x_2$, $x_3 \leq 0.7$.

DETAILED DESCRIPTION OF THE PREFERRED EMBODIMENTS

This invention provides a buried-heterostructure semiconductor laser which can emit highly collimated beams of narrow beam divergence and which is meritorious against the degradation characteristics due to damage of the end facets of the semiconductor laser.

Figure 1:
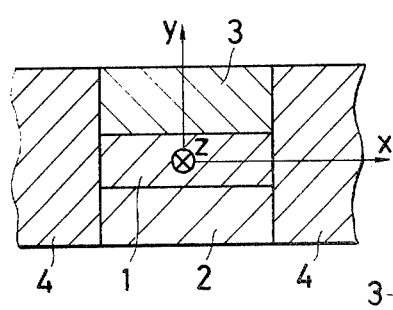
FIG. 1 shows a sectional view of an optical confinement region in a semiconductor laser of this invention, the view being taken perpendicularly to a laser beam.
Figure 2:
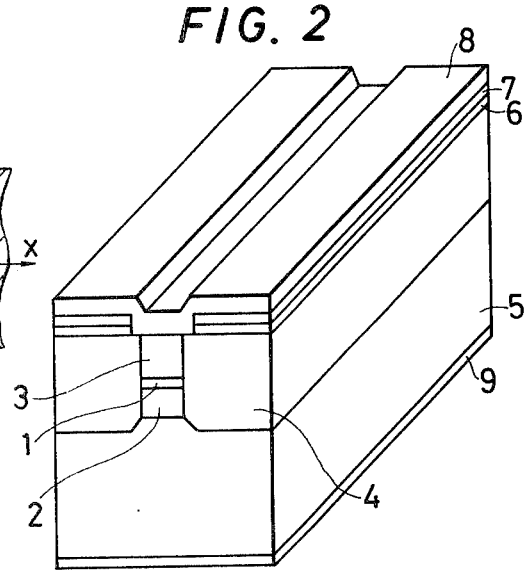
FIG. 2 shows an embodiment of the semiconductor laser of this invention.

FIG. 1 shows a sectional view perpendicular to a laser beam, of the semiconductor laser of this invention. It illustrates the principal portion for executing a laser oscillation, that is, an optical confinement region. FIG. 2 is a perspective view showing the fundamental construction of the semiconductor laser of this invention. A first semiconductor layer 1 serving as an active layer is sandwiched between a second semiconductor layer 2 and a third semiconductor layer 3 whose refractive index is lower than that of the active layer and whose conductivity types are opposite to each other. Thus, a heterostructure is built up. This region extends in the form of a stripe in the z-axial direction in FIG. 1. Further, portions of a fourth semiconductor layer are provided so as to sandwich the striped region therebetween. At this time, the fourth semiconductor layer is disposed on the surfaces of the striped region perpendicular to the surfaces from which light is emitted, so that all the first, second and third semiconductor layers may be buried in contact therewith.

The fourth semiconductor layer 4 is made of a semiconductor whose refractive index ($n_4$) is higher than the refractive indices ($n_2$ and $n_3$) of the second semiconductor layer 2 and the third semiconductor layer 3 and whose band gap ($Eg_4$) is greater than the band gap ($Eg_1$) of the active layer. When the value of the thickness (d) of the active layer is small, light penetrates into the second semiconductor layer 2 and the third semiconductor layer 3. For this reason, the equivalent refractive index ($n_{leq}$) of the active layer 1 which gives the propagation constant of light in the active layer becomes sufficiently lower than the refractive index ($n_1$) determined by the substance. In general, the thickness of the active layer is set to be equal to or less than the wavelength (λ) of a laser beam which is generates within the active layer by current injection. When the active layer becomes thin and the effective refractive index ($n_{leq}$) of the active layer 1 becomes lower than the refractive index ($n_4$) of the fourth semiconductor layer 4, light leaks out to the fourth semiconductor layer 4 at an angle θ with respect to the propagating direction of the light. The leakage angle θ is given by:

$$\sin\theta = (n_4^2 - n_{leq}^2)^{\frac{1}{2}}/n_4 \quad (1)$$

Further, the band gap of the fourth semiconductor layer 4 is greater than that of the active layer as described previously. Therefore, the light having leaked out is subject to substantially no absorption loss, and the laser device oscillates in this state (i.e., leaky-mode).

To sum up, the semiconductor laser device according to this invention is set at the relations of $d \leq \lambda$; $n_2$, $n_3 < n_4 < n_1$; and $Eg_1 < Eg_4$, and has the effective refractive index ($n_{leq}$) of the active layer made lower than the refractive index ($n_4$) of the fourth semiconductor layer (that is, $n_{leq} < n_4$).

The effective refractive index ($n_{leq}$) of the active layer 1 may be calculated for an optical waveguide model by using Maxwell's equation. The general method of approximation is described in, for example, "Introduction to Optical Electronics," Amnon Yaviv, Holt. Rinehart and Winston Inc., 1971, p 40–47. It will now be briefly explained.

As shown in FIG. 1, the optical confinement region of the semiconductor laser of this invention has the two-dimensional optical waveguide structure wherein the first semiconductor layer (active layer) is surrounded in the vertical direction by the second and third semiconductor regions having the lower refractive indices than the first semiconductor region and in the lateral direction by the fourth semiconductor region. In the case of the semiconductor laser, however, the thickness of the active layer is sufficiently smaller than the width thereof, and the distribution of waves in the vertical direction is scarcely affected by the confinement effect in the lateral direction. The aforecited effective refractive index ($n_{leq}$) of the active layer 1 may therefore be evaluated for waves propagating within a one-dimensional waveguide in which the region of the active layer 1 has the thickness d and has infinite extension in the lateral direction.

Accordingly, when the first semiconductor layer shown in FIG. 1 is represented by a region I and the second and third semiconductor layers are represented by a region II, the waves of the respective regions can be put as follows. Even where the refractive indices of the second and third semiconductor layers are not equal, the calculation may be made as follows:

$$\begin{cases} E^y = E_o \cos(K_y y + \phi) \exp(-iK_z z + i\omega t) & (2) \\ \quad \text{region I} \\ E^y = E_o \exp(-K_{y2} y) \exp(-iK_z z + i\omega t) & (3) \\ \quad \text{region II} \end{cases}$$

where $K_y$ and $K_{y2}$ denote the y-directional propagation constants of the waves in the respective regions I and II, $K_z$ denotes the z-directional propagation constant, $\phi$ denotes the phase factor, and $\omega$ denotes the angular frequency. By substituting Eqs. (2) and (3) into Maxwell's equation, the following equation is obtained:

$$K_y^2 + K_{y2}^2 = K_1^2 - K_2^2 \quad (K_i = 2\pi/(\lambda n_i), i=1, 2) \quad (4)$$

where $n_i$ denotes the refractive index of each region, and λ denotes the wavelength of the light in vacuum.

From the condition of continuity of the electric field and the first-order differential coefficient thereof in the regions I and II, the following equation is obtained:

$$K_y d = p\pi - 2\tan^{-1} K_y/K_{y2} \quad (p=0, 1, 2, \ldots) \quad (5)$$

where p corresponds to the mode number of the waves.

In the laser oscillation, higher-order modes are not used in practice, and p=0 may therefore be assumed. On the other hand, the effective refractive index caused by the fact that the propagating waves are confined in the vertical direction is given by:

$$(K_1)_{eff}^2 = K_1^2 - K_y^2 \qquad (6)$$

Therefore, the following relation holds:

$$(2\pi/\lambda n_{leq})^2 = K_1^2 - K_y^2 \qquad (7)$$

Accordingly, $n_{leq}$ is calculated by Eq. (7) with $K_y$ which is evaluated by Eqs. (4) and (5). $n_1$, $n_2$ (and $n_3$), $n_4$ and d may be selected so that the value $n_{leq}$ may become smaller than $n_4$.

These relations will be explained with reference to FIG. 3. The figure illustrates the relations among the refractive indices of the respective semiconductor layers and the thickness (d) of the active layer. The ordinate represents ($n_1-n_2$), and the abscissa ($n_1-n_4$). Conditions for establishing $n_{leq}=n_4$ are illustratively indicated with d being a parameter.

Figure 3:
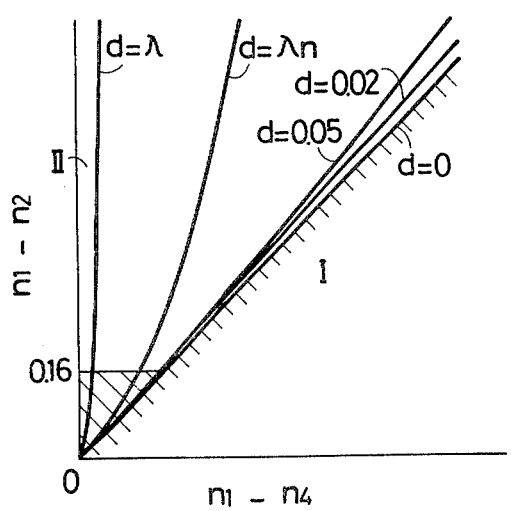
FIG. 3 is a diagram for explaining the relationship between conditions for establishing $n_{leq} = n_4$ and differences of the refractive indices of respective semiconductor layers in the semiconductor laser of this invention.

In a region on the right of a straight line at d=0 in FIG. 3 (region I), no leaky-mode oscillation is caused. This region corresponds to $n_2 > n_4$. When d is set in a region on the left of d=λ (region II), the active layer is too thick, and hence, the increase of the threshold current is too large, so that essentially the leaky-mode oscillation is difficult to be maintained. Further, it is more advantageous in point of the threshold current to make d smaller than $\lambda_n$ (the wavelength of the light within the active layer). When a thickness $d_o$ is set for a certain active layer, $n_1$ and $n_2$ may be set in a region on the left side of a curve at $n_{leq}=n_4$ for $d=d_o$ in FIG. 3.

Accordingly, the thickness of the active layer is set at d=0 to d=λ, more preferably at d=0 to d=$\lambda_n$. For the present, as the thickness of the active layer, a value of 0.02–0.03 μm is the limitation enduring the use, and a value of 0.05–0.22 μm is often used in practice.

The thicknesses of the second and third semiconductor layers may be to the extent of being capable of forming the conventional double-heterostructure, and are made 1 μm to 5 μm respectively.

The width of the active layer may also be as usual, and is made approximately 1 μm to 20 μm.

It is as stated before that the leakage angle θ is determined by the relation between $n_{leq}$ and $n_4$.

In order to actually make the beam divergence less than 1°, the leakage angles θ may be made greater than 3°, preferably greater than 5°. In principle, there is no upper limit of θ. In actuality, however, a value of 20°–30° will be the limitation though the size of the semiconductor laser is also a determinant.

In order to maintain the laser oscillation, the difference of the refractive indices of the first semiconductor layer and the second and third semiconductor layers which form the hetero-junctions needs, in actuality, to be above about 0.16.

The above description will now be summed up.

The thickness $d_o$ of the active layer is made 0.02 μm to λ, and the values $n_1$, $n_2$ ($n_3$) and $n_4$ are set to the region which is bounded by the y-axis and the curve establishing $n_{leq}=n_4$ at $d=d_o$. In this case, ($n_1-n_2$) is made above 0.16. The maximum value of ($n_1-n_2$) is limited by the maximum values which the refractive indices of the respective semiconductor materials can take.

This invention will be described more in detail in connection with an example.

The fundamental construction of the semiconductor laser of this invention is as shown in FIG. 2. On an n-type GaAs substrate 5 with the (1 0 0) face polished into a mirror surface, an n-type $Ga_{1-x2}Al_{x2}As$ layer 2 to serve as the second semiconductor layer (for example, $x_2=0.4$, Sn-doped, $N_D-N_A$: $5\times10^{17}$ cm$^{-3}$ where $N_D$ denotes the donor impurity concentration and $N_A$ the acceptor impurity concentration), a $Ga_{1-x1}Al_{x1}As$ layer 1 to serve as the first semiconductor layer (for example, $x_1=0.1$, undoped) and a p-type $Ga_{1-x3}Al_{x3}As$ layer 3 to serve as the third semiconductor layer (for example, $x_3=0.4$, Ge-doped, $N_A-N_D$: $5\times10^{18}$ cm$^{-3}$) were successively grown by the well-known liquid epitaxial growth. The thicknesses of the second semiconductor layer 2, the first semiconductor 1 and the third semiconductor layer 3 were 2 μm, 0.14 μm and 2 μm, respectively.

On the resultant semiconductor substrate with the semiconductor layers epitaxially grown, an $SiO_2$ film was deposited to the extent of 3,000–4,000 Å. (The $SiO_2$ film may be formed by chemical vapor deposition.) The $SiO_2$ film was photoetched into the shape of an etching mask for use in the step of forming a belt-shaped cavity required for the laser oscillation, that is, it was shaped into a beltlike stripe. The beltlike stripe was extended in the <1 1 0> direction of the semiconductor substrate. The stripe width was 4 μm.

Thereafter, the first, second and third semiconductor layers were selectively etched so that parts to become a striped operating region might be left. The etchant used was a solution in which phosphoric acid, hydrogen peroxide and methanol were mixed at 1:1:3 in the volumetric ratio, and the temperature of the solution was held at 20° C. In this example, the width of the operating region was 4 μm. The $SiO_2$ film used as the etching mask was removed with an ammonium fluoride-fluoric acid solution.

On the semiconductor substrate subjected to the above processings, a $Ga_{1-x4}Al_{x4}As$ layer 4 to serve as the fourth semiconductor layer (for example, $x_4=0.25$, Ge-doped, $N_A-N_D$: $10^{16}$ cm$^{-3}$) was again grown by the liquid epitaxial growth. By the growth of the fourth semiconductor layer, the mesa-shaped multi layer formed by the first and second semiconductor layers was buried.

On the surface of the semiconductor substrate of the buried structure obtained by the above method, an $Al_2O_3$ film 6 having a thickness of 1,200 Å and a phosphorus silicate glass film 7 having a thickness of 2,000 Å were deposited by the chemical vapor deposition. The $Al_2O_3$ film 6 and the phosphorus silicate glass film 7 which overlay the operating region were removed by the photoetching, to form an electrode hole. Thereafter, using the vacuum evaporation, an Au-Ge-Ni alloy was deposited to a thickness of 1.5 μm as an ohmic electrode 9 for the n-type GaAs, and a Cr-Au alloy was deposited to a thickness of 1.5 μm as an ohmic electrode 8 for the p-type $Ga_{1-x3}Al_{x3}As$. By stripping the resultant substrate in the <1 1 0> direction, i.e., the stripe direction and cleaving it in the <$\bar{1}$ 1 0> direction, a semiconductor laser having a width of 500 μm (<$\bar{1}$ 1 0> direction) and a cavity length of 300 μm (<1 1 0> direction) was obtained.

Figure 4:
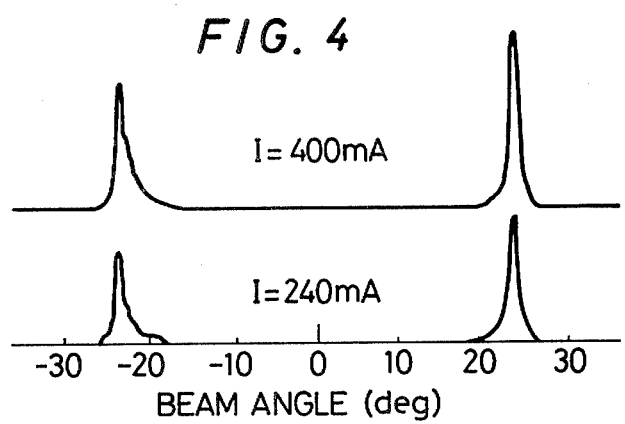
FIG. 4 shows the far-field intensity distributions of a laser beam in a direction parallel to the p-n junction of the semiconductor laser of this invention.

Examples of the far-field intensity distribution of the semiconductor laser fabricated by the above process are shown in FIG. 4. This figure represents the intensity distribution of a laser beam in a direction parallel to the active layer, within planes parallel to the end faces of the laser. The abscissa represents the beam angle. The oscillation wavelength of this laser device is 8,100 Å, and the threshold current is 230 mA. The laser beam is divided and emitted in two directions of approximately ±24°. The angle at which the intensity of each beam component becomes ½ is below 1° and is very narrow, so that it is highly collimated. (Naturally, the spreading of the beam in a direction perpendicular to the active layer is dependent upon the thickness of the layer.) As seen from the figure, even when the injection current is increased, the emerging direction of the laser beam does not change, and the half-width of the laser beam does not change, either. In the semiconductor lasers of the prior-art structures, the half-width of a laser beam exceeds 4° even in case of the laser exhibiting comparatively narrow angles. Moreover, when the injection current is increased, it often occurs that the radiating direction of the laser beam changes or that the oscillation mode becomes unstable. These points are disadvantageous when, for example, the coupling with an optical fiber is considered. In the semiconductor laser of this invention, these problems have been solved as described above.

$Eg_1 \sim 1.55$ eV and $Eg_4 \sim 1.76$ eV, so that the laser beam is subject to substantially no absorption loss.

Figure 5:
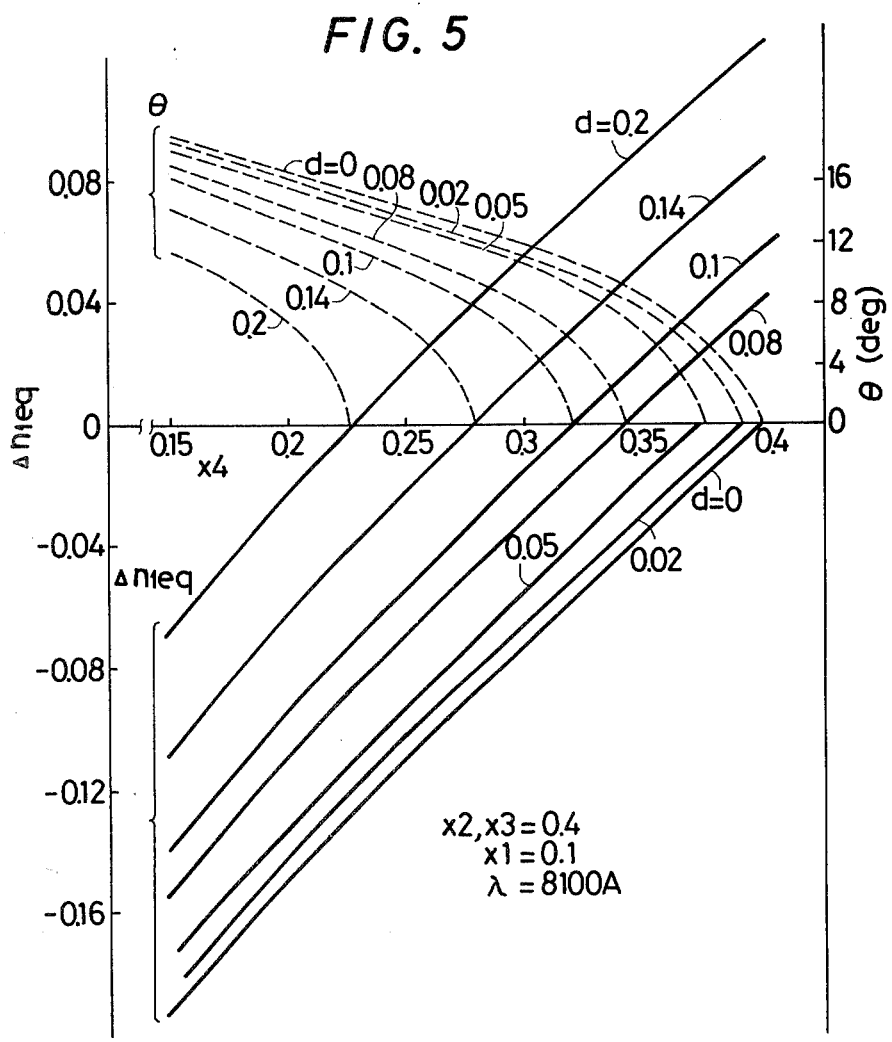
FIG. 5 shows the calculated differences of refractive indices $\Delta n_{leq}$ (solid lines, $\Delta n_{leq} = n_{leq} - n_4$, and leakage angles θ (dotted lines) versus various AlAs mole fractions in perpendicular layers.

In the example, $n_1 \sim 3.58$; $n_2$, $n_3 \sim 3.35$; $n_4 \sim 3.49$; and $n_{leq} \sim 3.47$. At this time, the leakage angle $\theta$ is about 6°. FIG. 5 illustrates, as to this semiconductor laser, how the quantity $\Delta n_{leq}$ ($=n_{leq}-n_4$) and the leakage angle $\theta$ vary versus the burying material. The abscissa represents the AlAs mole fractions $x_4$ in the fourth semiconductor layer, and the ordinate represent $\Delta n_{leq}$ (solid lines) and $\theta$ (dotted lines). The respective relations are indicated with the thickness d of the active layer being made a parameter.

Figure 6:
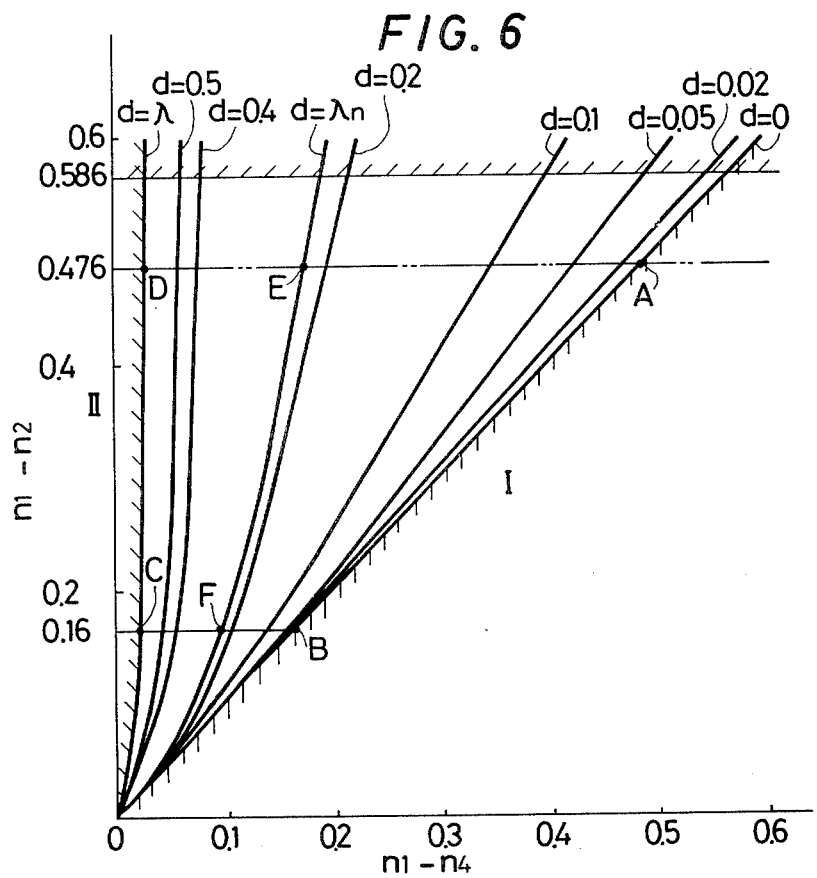
FIG. 6 is a diagram for explaining the relationship between conditions for establishing $n_{leq}=n_4$ and differences of the refractive indices of respective semiconductor layers in a semiconductor laser which employs GaAlAs as a semiconductor material.

With regard to the semiconductor laser of the $Ga_{1-xi}Al_{xi}As$ system thus far described, the relationship among the refractive indices of the respective semiconductors will be explained. FIG. 6 shows the relations of the refractive indices of the respective semiconductor layers and the thickness of the active layer in the case of employing a $Ga_{1-x1}Al_{x1}As$ layer as the first semiconductor layer (active layer), $Ga_{1-x2}Al_{x2}As$ layers as the second and third semiconductor layers, and a $Ga_{1-x4}Al_{x4}As$ layer as the fourth semiconductor layer (where $0 \leq x_1 < x_4 < x_2 \leq 0.7$). $Ga_{1-b}Al_bAs$ (where $0 \leq b < 0.7$) can be used for the semiconductor substrate. As in FIG. 3, the ordinate represents $(n_1-n_2)$, and the abscissa $(n_1-n_4)$.

FIG. 6 shows a family of curves for $n_{leq}=n_4$ for various values of d, wherein the y-axis represents the difference $(n_1-n_2)$ and the x-axis represents the difference $(n_1-n_4)$.

In an $Al_{xi}Ga_{1-xi}As$ system, the maximum value of the difference $(n_1-n_2)$ may theoretically be realized when $x_1=0$ and $x_2=1$. This maximum value is 0.586. Further, at $x_2=0.7$ or so, the growth of the second semiconductor layer becomes difficult. Accordingly, the value of $(n_1-n_2)$ at this time (at $x_1=0$, $x_2=0.7$) or 0.476 is the maximum value in practical use. When the value of $(n_1-n_2)$ is less than 0.16 (for example, when $x_1=0.05$ and $x_2=0.18$), the increase of the threshold current becomes large, so that such small values are not practical.

It is understood from these results that the semiconductor laser of this invention can be realized by setting the various quantities as follows.

The thickness of the active layer is made 0.02 $\mu$m to 0.5 $\mu$m. When the thickness $d_o$ of the desired active layer is set, the second (and third) and fourth semiconductor layers may be set so that the relation of $n_1$, $n_2$ and $n_4$ may exist in a region on the left side of the curve of $n_{leq}=n_4$ for $d=d_o$ in FIG. 6. In this case, $(n_1-n_2)$ is selected to fall within a range of from 0.16 to 0.476.

Further, as stated previously, d should preferably be smaller than $\lambda_n$ in order to realize a low threshold current. It is more practical and favorable to set d at 0.05 $\mu$m to 0.22 $\mu$m.

There were fabricated semiconductor lasers wherein, in accordance with the above, the design conditions of the thickness of the active layer and the refractive indices of the respective semiconductor layers were varied as indicated in Table 1. It has been confirmed that, according to this invention, highly collimated laser beams are obtained.

Likewise to the foregoing example, the fundamental structure was such that the semiconductor substrate was an n-GaAs substrate, that the first semiconductor layer was an undoped $Ga_{1-x1}Al_{x1}As$ layer, that the second and third semiconductor layers were p-$Ga_{1-x2}Al_{x2}As$ layers, and that the fourth semiconductor layer was a $Ga_{1-x4}Al_{x4}As$ layer. The specifications of the respective layers were as given in Table 1. The second and third semiconductor layers held the first semiconductor layer therebetween, and were 2 $\mu$m thick respectively.

The operation was conducted by the pulse drive employing pulses at a frequency of 10 kHz and with a width of 2 $\mu$sec.

TABLE 1

| | | Design Conditions | | | | Characteristics | | | |
|---|---|---|---|---|---|---|---|---|---|
| | d ($\mu$m) | stripe width ($\mu$m) | $x_1$ | $x_2$ | $x_4$ | half-width (deg.) | $\lambda$ (Å) | threshold current (mA) | |
| Sample 1 | 0.5 | 4 | 0.07 | 0.65 | 0.096 | less than 0.5° | 8300 | ~300 | $n_1 = 3.6264$<br>$n_2 = n_3 = 3.185$<br>$n_4 = 3.586$<br>$\Delta n_{leq} = -0.02$ |
| Sample 2 | 0.1 | 4 | 0.07 | 0.65 | 0.48 | ~1° | 8300 | ~70 | $n_1 = 3.6264$<br>$n_2 = n_3 = 3.185$<br>$n_4 = 3.300$<br>$\Delta n_{leq} = -0.012$ |
| Sample 3 | 0.5 | 4 | 0.05 | 0.18 | 0.065 | ~1° | 8500 | ~300 | $n_1 = 3.665$<br>$n_2 = n_3 = 3.505$<br>$n_4 = 3.635$<br>$\Delta n_{leq} = -0.012$ |
| Sample 4 | 0.05 | 4 | 0.05 | 0.18 | 0.17 | ~3° | 8500 | ~200 | $n_1 = 3.665$<br>$n_2 = n_3 = 3.505$<br>$n_4 = 3.514$ |

TABLE 1-continued

| Design Conditions | | | | | Characteristics | | |
|---|---|---|---|---|---|---|---|
| d (μm) | stripe width (μm) | $x_1$ | $x_2$ | $x_4$ | half-width (deg.) | λ (Å) | threshold current (mA) |
| | | | | | | | $\Delta n_{/eq} = -0.007$ |

Degradation characteristics were compared between the semiconductor laser of this invention and a semiconductor laser of the mesa-stripe structure having heretofore been well known.

The semiconductor laser of the mesa-stripe structure had specifications as will now be described. A substrate was made of n-type GaAs with the (1 0 0) face polished into a mirror surface. A hetero-junction portion was fabricated in such a way that an n-type $Ga_{1-y}Al_yAs$ layer (y=0.4, Sn-doped, $N_D-N_A$: $5\times10^{17}$ cm$^{-3}$) being 2 μm thick, an undoped $Ga_{1-x}Al_xAs$ layer (x=0.07) being 0.14 μm thick and to serve as an active layer, and a p-type $Ga_{1-y}Al_yAs$ layer (y=0.4, Ge-doped, $N_A-N_D$: $5\times10^{18}$ cm$^{-3}$) being 2 μm thick were successively grown by the well-known liquid epitaxial growth.

The semiconductor laser thus fabricated was operated continuously at a constant current for about 1,000 hours at an initial light output of 2 mW for 1 μm of the width of the active layer. In the semiconductor laser of this structure, the light output lowered to about 60% of the initial value. On the other hand, in the leaky-mode buried-heterostructure semiconductor laser of this invention described above, almost no change of the light output was noted. The end facets of the lasers were observed with a differential interference microscope. Then, in the conventional laser, considerable end-face damage was noted on the active layer. In contrast, in the semiconductor laser of this invention, almost no damage was noted.

Figure 7:
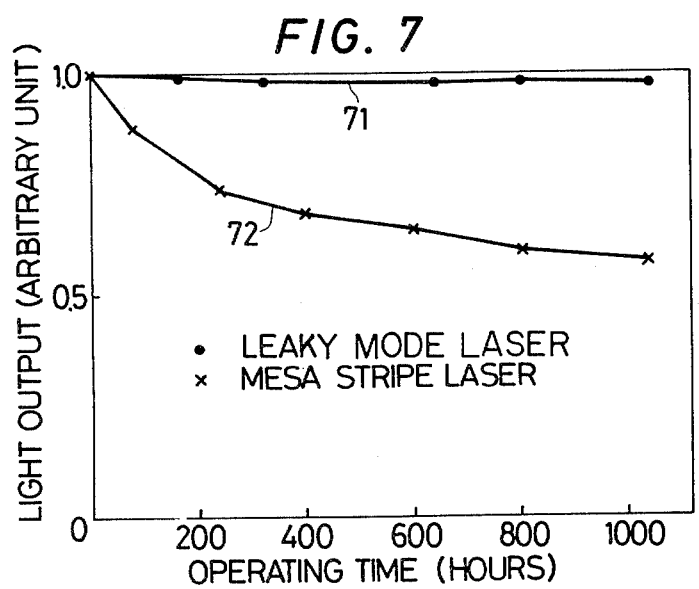
FIG. 7 is a diagram showing the changes of the light output of a semiconductor laser with operating time.

FIG. 7 shows typical examples of the changes of the light outputs of both the semiconductor lasers with operating time. A curve 71 corresponds to the semiconductor laser of this invention, while a curve 72 corresponds to the mesa-stripe type semiconductor laser.

In this manner, the semiconductor laser of this invention is excellent also in the reliability.

Although GaAlAs was used in the aforecited concrete example, other semiconductor materials can also be employed. Another example will now be explained.

Hetero-junctions were constructed in such a way that $In_{0.78}Ga_{0.22}P_{0.53}As_{0.47}$ ($E_1=1.033$ eV) as the first semiconductor layer, n-type InP as the second semiconductor layer, and p-type InP as the third semiconductor layer were deposited on an n-type InP substrate by the liquid epitaxial growth. The first semiconductor layer was 0.2 μm thick, and the second and third semiconductor layers were 3 μm thick. A stripe region to serve as the operating region was formed in such a way that the selective etching with bromine in methanol was carried out by using $SiO_2$ for an etching mask. The fourth semiconductor layer was formed of $In_{0.88}Ga_{0.12}P_{0.77}As_{0.23}$ ($E_4=1.127$ eV). The fundamental construction was as shown in FIG. 2, and the width of the stripe forming the hetero-junctions was made 4 μm. By evaporation, an Au-Sn electrode was formed on the InP substrate, and an Au-Zn electrode on the p-type InP layer. The cavity length was made 300 μm.

The semiconductor laser thus formed operated at an oscillation wavelength of ~1.2 μm, a threshold current value of ~200 mA and a beam half-width of ~1°.

In this manner, the present invention is applicable to a wide range of semiconductor lasers made of, not only Ga-Al-As, but also Ga-Al-As-Sb, Ga-Al-As-P, Ga-As-P, In-Ga-As-P, and other groups III-V compound semiconductors, groups II-V compound semiconductors, etc.

What we claim is:

1. A semiconductor laser device comprising:
   a semiconductor substrate;
   an optical confinement region formed of a semiconductor material assembly disposed above said substrate and including
      a multilyaer semiconductor laminated structure formed of
         a first semiconductor layer having a prescribed thickness which is no greater than the oscillation wavelength of light produced by said laser device,
         a second semiconductor layer disposed beneath said first semiconductor layer, and
         a third semiconductor layer disposed above said first semiconductor layer,
         the refractive indices of said second and third semiconductor layers being lower than the refractive index of said first semiconductor layer, and the conductivity types of said second and third semiconductor layers being opposite each other, and
      a fourth semiconductor layer having first and second portions disposed alongside and contacting opposite side faces of each of the first, second, and third semiconductor layers of said multilayer semiconductor laminated structure, so that said first semiconductor layer is buried within structure formed by said second, third, and fourth semiconductor layers, said fourth semiconductor layer having a band gap greater than that of said first semiconductor layer, and having a refractive index which is higher than the refractive indices of said second and third layers and which is higher than the effective refractive index of the buried first semiconductor layer;
   a first electrode disposed upon one surface of said optical confinement region; and
   a second electrode disposed upon one surface of said semiconductor substrate; and
   means, including said optical confinement region, for forming a resonant optical cavity for optical radiation travelling in a direction parallel to said opposite side faces.

2. A semiconductor laser device according to claim 1, wherein the thickness of said first semiconductor layer is 0.02 μm to 0.5 μm.

3. A semiconductor laser device according to claim 1, wherein the thickness of said first semiconductor layer is 0.02 μm to $\lambda_n$, wherein $\lambda_n$ is the wavelength of light within said active layer corresponding to the oscillation wavelength of light produced by said laser device.

4. A semiconductor laser device according to claim 1, wherein the thickness of said first semiconductor layer is 0.05 μm to 0.22 μm.

5. A semiconductor laser device according to claim 22, wherein the effective refractive index of said first semiconductor layer ($n_{1eq}$) is given by the equation:

$$n_{1eq} = \frac{2\pi}{\lambda} \frac{1}{(K_1^2 - K_y^2)^{\frac{1}{2}}}$$

wherein $K_y$ is the propagation constant, in the direction perpendicular to the heterojunction plane, of waves in the first semiconductor layer, and $K_1$ is defined, in relation to the refractive index ($n_1$) of the first layer, by $K_1 = 2\pi/(\lambda n_1)$.

6. A semiconductor laser device according to claim 1, wherein said first semiconductor layer of said optical confinement region is made of $Ga_{1-x_1}Al_{x_1}As$, said second semiconductor layer is made of $Ga_{1-x_2}Al_{x_2}As$, said third semiconductor layer is made of $Ga_{1-x_3}Al_{x_3}As$, and said fourth semiconductor layer is made of $Ga_{1-x_4}Al_{x_4}As$, and $0 \leq x_1 < x_4 < x_2$, $x_3 \leq 0.7$.

7. A semiconductor laser device according to claim 5, wherein said first semiconductor layer of said optical confinement region is made of $Ga_{1-x_1}Al_{x_1}As$, said second semiconductor layer is made of $Ga_{1-x_2}Al_{x_2}As$, said third semiconductor layer is made of $Ga_{1-x_3}Al_{x_3}As$, and said fourth semiconductor layer is made of $Ga_{1-x_4}Al_{x_4}As$, and $0 \leq x_1 < x_4 < x_2$, $x_3 \leq 0.7$.

8. A semiconductor laser device according to claim 6, wherein the thickness of said first semiconductor layer is 0.02 μm to 0.5 μm.

9. A semiconductor laser device according to claim 5, wherein the thickness of said first semiconductor layer is 0.02 μm to $\lambda_n$, wherein $\lambda_n$ is the wavelength of light within said active layer corresponding to said oscillation wavelength of light produced by said laser device.

10. A semiconductor laser device according to claim 6, wherein the thickness of said first semiconductor layer is 0.02 μm to $\lambda_n$, wherein $\lambda_n$ is the wavelength of light within said active layer corresponding to said oscillation wavelength of light produced by said laser device.

11. A semiconductor laser device according to claim 7, wherein the thickness of said first semiconductor layer is 0.02 μm to $\lambda_n$, wherein $\lambda_n$ is the wavelength of light within said active layer corresponding to said oscillation wavelength of light produced by said laser device.

12. A semiconductor laser device according to claim 5, wherein the thickness of said first semiconductor layer is 0.05 μm to 0.22 μm.

13. A semiconductor laser device according to claim 6, wherein the thickness of said first semiconductor layer is 0.05 μm to 0.22 μm.

14. A semiconductor laser device according to claim 7, wherein the thickness of said first semiconductor layer is 0.05 μm to 0.22 μm.

15. A semiconductor laser device according to claim 6, wherein the difference between the refractive index of said first semiconductor layer and those of said second and third semiconductor layers is 0.16 to 0.476.

16. A semiconductor laser device according to claim 7, wherein the difference between the refractive index of said first semiconductor layer and those of said second and third semiconductor layers is 0.16 to 0.476.

17. A semiconductor laser device according to claim 8, wherein the difference between the refractive index of said first semiconductor layer and those of said second and third semiconductor layers is 0.16 to 0.476.

18. A semiconductor laser device according to claim 9, wherein the difference between the refractive index of said first semiconductor layer and those of said second and third semiconductor layers is 0.16 to 0.476.

19. A semiconductor laser device according to claim 11, wherein the difference between the refractive index of said first semiconductor layer and those of said second and third semiconductor layers is 0.16 to 0.476.

20. A semiconductor laser device according to claim 13, wherein the difference between the refractive index of said first semiconductor layer and those of said second and third semiconductor layers is 0.16 to 0.476.

21. A semiconductor laser device according to claim 14, wherein the difference between the refractive index of said first semiconductor layer and those of said second and third semiconductor layers is 0.16 to 0.476.

22. A semiconductor laser device according to claim 5, wherein the thickness of said first semiconductor layer is 0.02 μm to 0.5 μm.

* * * * *